United States Patent [19]
Inoue

[11] Patent Number: 5,344,498
[45] Date of Patent: Sep. 6, 1994

[54] SOLAR CELL MODULE WITH IMPROVED WEATHERING CHARACTERISTICS

[75] Inventor: Yuji Inoue, Nagahama, Japan

[73] Assignee: Canon Kabushiki Kaisha, Tokyo, Japan

[21] Appl. No.: 957,374

[22] Filed: Oct. 7, 1992

[30] Foreign Application Priority Data

Oct. 8, 1991 [JP] Japan .................................. 3-260716

[51] Int. Cl.$^5$ .......................................... H01L 31/048
[52] U.S. Cl. .................... 136/251; 136/256; 136/258; 136/259; 257/788; 257/789; 257/791; 257/792
[58] Field of Search ....... 136/251, 256, 244, 258 AM, 136/259; 257/788–792

[56] References Cited

FOREIGN PATENT DOCUMENTS 63-185071  7/1988  Japan .................................. 136/259
3-185769   8/1991  Japan .................................. 136/259

*Primary Examiner*—Aaron Weisstuch
*Attorney, Agent, or Firm*—Fitzpatrick, Cella, Harper & Scinto

[57] ABSTRACT

An improved solar cell characterized in that the grid electrode has a coating comprising an epoxy resin of 20 g/m$^2$.day.0.1 mm/40° C.90%RH or less in moisture permeability which is disposed so as to cover the entire exposed exterior of said grid electrode. The solar cell module is free of short-circuits between the grid electrode and the lower electrode even upon repeated use under severe environmental conditions of high temperature and high humidity, and continuously exhibits a desirable photoelectric conversion efficiency over a long period of time.

16 Claims, 7 Drawing Sheets

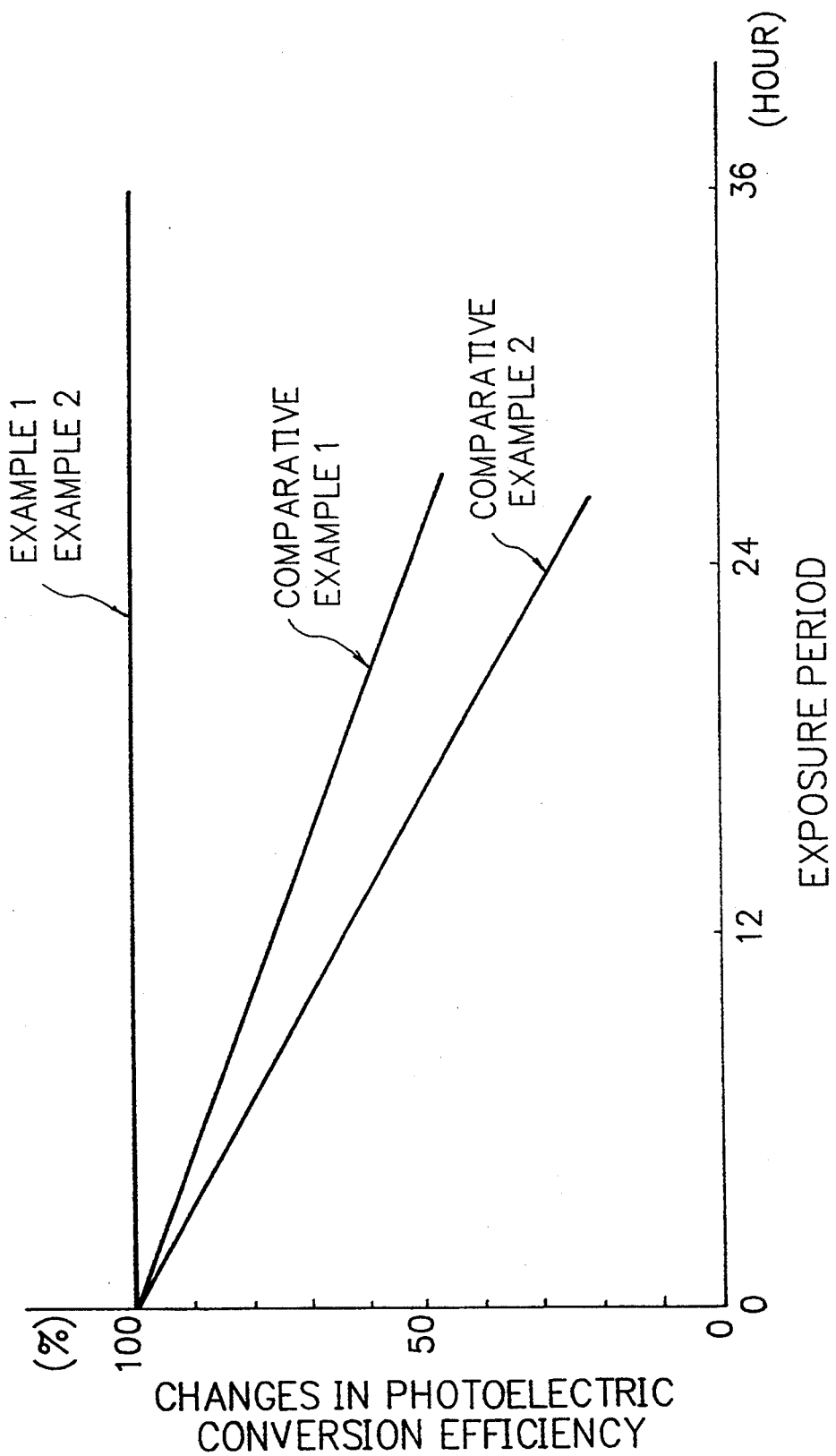

SOLAR CELL MODULE WITH IMPROVED WEATHERING CHARACTERISTICS

BACKGROUND OF THE INVENTION

1. Field of the Invention

The present invention relates to an improved solar cell module which excels in weather resistance and exhibits a stable, desirable photoelectric conversion efficiency over a long period of time. More particularly, it relates to a solar cell module having an a-Si solar cell element provided with a grid electrode having a coating comprising a specific epoxy resin disposed so as to cover the entire exterior of the grid electrode.

2. Related Background Art

In recent years, heating of the earth because of the so-called greenhouse effect due to an increase of atmospheric $CO_2$ has been predicted. Thus, there is an increased demand for a means of power generation capable of providing clean energy without causing $CO_2$-buildup. In this regard, nuclear power generation has been considered advantageous in view of not causing $CO_2$ buildup. However, nuclear power generation unavoidably produces radioactive wastes which are harmful for living things, and there is a probability that leakage of injurious radioactive materials from the nuclear power generation system will happen when the system is damaged. In this respect, early realization of a power generation system capable of providing clean energy without causing $CO_2$ buildup as in the case of thermal power generation and without causing radioactive wastes and radioactive materials as in the case of nuclear power generation is an increased societal demand.

There have been various proposals to meet such societal demand. Among those proposals, solar cells are expected to be a future power generation source since they supply electric power without causing the problems mentioned above.

There have been proposed a variety of solar cells for commercial and home appliances. These solar cells include single crystal silicon cells, polycrystal silicon solar cells, and amorphous silicon solar cells.

As for single crystal silicon solar cells, there is a disadvantage that they are still costly because they use an expensive specific single crystal substrate. Hence, they have not yet come into general use as solar cells in commercial and home appliances used by the general public.

In view of this, public attention has been focused on polycrystal silicon solar cells and amorphous silicon solar cells. They can be relatively easily produced and are of low production cost, although they do not provide a photoelectric conversion efficiency as high as that provided by the single crystal silicon solar cells.

However, as for polycrystal silicon solar cells, there is a disadvantage in that it is difficult to form the semiconductor layer comprised of polycrystal silicon (hereinafter referred to as poly-Si) in a large area with a relatively low production cost.

On the other hand, amorphous silicon solar cells have been evaluated as being the most advantageous among the conventional solar cells because their semiconductor layer, comprised of amorphous silicon (hereinafter referred to as a-Si), can be easily formed in a large area and in a desired form on a relatively inexpensive substrate of glass, metal, or synthetic resin with a relatively low production cost.

As for amorphous silicon solar cells (hereinafter referred to as a-Si solar cells), the production cost has been estimated to be markedly lower than that of single crystal silicon solar cells when the production reaches several hundreds of megawatts. In view of this, various studies have been made on a-Si solar cells from various viewpoints such as reproducibility, productivity, production cost, etc.

Now, an a-Si solar cell module capable of outputting an electric power of several watts or above is usually used outdoors and because of this, it is required to have relevant weathering resistances in terms of resistance to rain (water), dust, ultraviolet rays, heat, humidity, and the like. In the production of an a-Si solar cell module, an a-Si solar cell is encapsulated using a glass plate or a synthetic resin so that the above requirements are fulfilled.

In the case where the a-Si solar cell is encapsulated using a glass plate, it is necessary for the glass plate to be of a thickness of several millimeters in order to prevent the glass plate from being broken. In this case, the a-Si solar cell module unavoidably becomes relatively heavy and costly. In addition, the a-Si solar cell module is poor in flexibility.

In the case of producing a solar cell module using an a-Si solar cell element with a bendable substrate such as stainless steel foil, synthetic resin film, or the like, the a-Si solar cell is encapsulated using a synthetic resin member such as a film of fluorine-containing resin, ethylene-vinyl acetate copolymer (EVA), or the like so that the resulting a-Si solar cell module becomes bendable as desired.

In the following, explanation will be made of the conventional a-Si solar cell module shown in FIG. 2.

FIG. 2 is a schematic view illustrating the configuration of a conventional a-Si solar cell module. In FIG. 2, reference numeral 200 indicates an a-Si solar cell element which comprises a metal electrode layer 202, an amorphous silicon semiconductor layer (hereinafter referred to as a-Si semiconductor layer) 203 having a pin junction, and a transparent and conductive layer 204 disposed in this order on a conductive substrate 201. Reference numeral 205 indicates a grid electrode. Reference numeral 206 designates a filler provided so as to enclose the entire exterior of the a-Si solar cell element 200. Reference numeral 207 indicates a weather-resistant protective member (or a surface protective member) made of a synthetic resin which is disposed on the surface of the filler 206. Reference numeral 208 indicates a base member (or rear face protective member).

The grid electrode 205 is usually formed using a paste composed of powdered Ag and binder resin in order to provide it with a desirable flexibility and a desirable resistance to changes in temperature. As the binder resin used in this case, there are known polyester resins exhibiting good flexibility, epoxy resins exhibiting good weather resistance, and other than these, phenol resins.

In order to obtain an a-Si solar cell module of the configuration shown in FIG. 2 which excels in flexibility, the grid electrode 205 is formed using Ag paste comprising polyester resin as the binder dispersed in powdered Ag.

The weather-resistant protective member 207 is usually formed of a fluorine-containing resin so that it exhibits water resistance, resistance to dust, weather resistance, etc. required therefor.

As for the filler 206 which encloses the solar cell element 200, it is required to be transparent and highly insulative and to have weather resistance, water resistance, and high-impact properties. Besides these requirements, it is also required to exhibit a good adhesion property to the solar cell element 200 and not to have any negative influence on other constituent members. In view of this, as the filler 206, there have been used EVA, silicone resin, or polyvinyl butyral (PVB). Among these resins, EVA is most generally used since it has various advantages such that it can be handled in a sheet-like state, it can be easily processed, and it is relatively inexpensive.

Now, there is a problem with the above-described conventional a-Si solar cell module such that not only the weather-resistant protective member 207 formed of a fluorine-containing resin but also the filler 206 comprised of EVA has a tendency to allow moisture to pass through them, although they have appropriate weather resistance and water resistance.

Besides this problem, there is another problem with the above-described conventional solar cell module such that the grid electrode 205 formed of the foregoing Ag paste comprising powdered Ag and polyester resin binder is apt to allow moisture to pass through the grid electrode. The moisture eventually arrives at the portion situated under the grid electrode because the Ag paste contains voids, although it meets the requirement relative to the flexibility needed therefor. This situation often occurs when the above-described conventional solar cell module is irradiated with light (sunlight) under conditions of high temperature and high humidity, wherein moisture penetrates the filler 206 and the grid electrode 205 and ultimately reaches the a-Si semiconductor layer 203 through the transparent and conductive layer 204. When the a-Si semiconductor layer 203 is accompanied by defective portions such as pinholes, the moisture passes through those defective portions of the a-Si semiconductor layer and reaches the metal electrode layer 202 (that is, the lower electrode), causing the grid electrode 205 to be short-circuited with the metal electrode 202 and thus reducing the solar cell characteristics.

In order to confirm the above problematic situation with respect to the conventional a-Si solar cell module in which the grid electrode is formed of the foregoing Ag paste comprising powdered Ag and polyester resin binder, a voltage was externally applied between the grid electrode and the metal electrode layer (that is, the lower electrode) so that a positive bias voltage was applied to the grid electrode. As a result, the above problems relative to the occurrence of short-circuits between the grid electrode and the lower electrode and to the reduction in photoelectric conversion efficiency were observed.

Occurrence of the above problems in the conventional a-Si solar cell module is considered to be due to the following reasons. That is, in the case where moisture has penetrated into the a-Si solar cell element 200 as above described upon subjecting the a-Si solar cell element to irradiation of light (sunlight) under condition of high temperature and high humidity, a positive voltage is applied to the grid electrode 205 because of the penetrated moisture and a self-generated photoelectromotive force of the a-Si solar cell element causes electrochemical reaction of the Ag contained in the grid electrode, whereby the Ag is oxidized in the moist media to provide $Ag^+$ ions. When the $Ag^+$ ions thus generated are diffused into the a-Si semiconductor layer, a remarkable reduction is caused in the photoelectric conversion efficiency of the a-Si solar cell element. And in the case where the a-Si semiconductor layer has defect portions such as pinholes, the $Ag^+$ ions reach the lower electrode (the metal electrode) through these defect portions, and they are reduced to metallic Ag. Should this reaction happen continuously, the metallic Ag eventually grows to produce a dendritic crystal, resulting in electrical connection of the grid electrode to the lower electrode, thereby causing short-circuiting of the a-Si solar cell element. As a result, a marked reduction is caused in the photoelectric conversion efficiency of the a-Si solar cell element.

The detailed reaction mechanism in this case is not clear but it is considered that the following reactions are likely to be caused in the a-Si solar cell element:

(1) at the grid electrode (which serves as an anode):

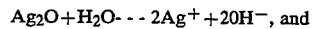

$Ag_2O + H_2O \text{---} 2Ag^+ + 2OH^-$, and (2) at the lower electrode (which serves as a cathode):

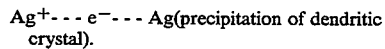

$Ag^+ \text{---} e^- \text{---} Ag$ (precipitation of dendritic crystal).

In order to prevent occurrence of the above-described short-circuit between the grid electrode and the lower electrode, there is a proposal to use epoxy resin instead of the polyester resin as the binder resin of the Ag paste for the formation of the grid electrode. However, as for an a-Si solar cell of the configuration shown in FIG. 2 in which the grid electrode 205 is formed of a paste comprising powdered Ag and epoxy resin, because the epoxy resin is hard and is insufficient in flexibility, although its moisture permeability is low, the grid electrode is likely to separate from the a-Si solar cell element body upon exposure to changes in temperature in repeated use, wherein the contact resistance between the grid electrode and the a-Si solar cell element body is raised, causing a marked reduction in the photoelectric conversion efficiency. Thus, the use of epoxy resin instead of the polyester resin as the binder resin of the Ag paste is not effective to solve the above problem.

Besides the above, in order to prevent occurrence of the above-described short-circuit between the grid electrode and the lower electrode, it is considered effective to replace EVA as the filler 206 with another resin having a lower moisture permeability.

In the technical field to which the present invention pertains, the degree of moisture which permeates a given material is evaluated by observing the so-called moisture permeability in accordance with the method stipulated in JIS-Z0208, in which how much moisture permeates said given material with a definite thickness and a definite area within a prescribed period of time under a specified temperature and moisture is measured.

The moisture permeability of EVA (ethylene-vinyl acetate copolymer) is 20 to 200 (g/m².day.0.1 mm/40° C.90%RH.

In view of this, other resins having a moisture permeability which is lower than that of EVA are resins having a moisture permeability of less than the above-mentioned moisture permeability value of EVA, that is, 20 g/m².day.0.1 mm/40° C.90%RH. Specific examples of such resins are polyethylene, polypropylene, polyvinyl alcohol, polymethyl methacrylate, polyethylene terephthalate, vinylidene chloride-vinyl chloride copolymer, and epoxy resin.

However, of these resins, polyethylene, polypropylene, polyvinyl alcohol, polymethyl methacrylate, polyethylene terephthalate, and vinylidene chloride-vinyl chloride copolymer are not usable instead of EVA as the filler 206 because each of them is poor in adhesion with the exterior of the solar cell element 200. Particularly, when an a-Si solar cell module of the configuration shown in FIG. 2 in which the filler 206 is comprised of a member selected from polyethylene, polypropylene, polyvinyl alcohol, polymethyl methacrylate, polyethylene terephthalate, and vinylidene chloride-vinyl chloride copolymer is bent, the filler 206 is likely to separate from the solar cell element. In addition, when said solar cell module is repeatedly exposed to high temperature, the filler 206 situated in the vicinity of the interface with the exterior of the solar cell element 200 is colored white and eventually separates from the exterior of the solar cell element. Further, when said solar cell is placed outdoors so as to be exposed to sunlight over a long period of time, the filler 206 is yellowed.

In the case of an a-Si solar cell module of the configuration shown in FIG. 2 in which the filler 206 is comprised of epoxy resin, there also is a problem that the filler is yellowed when the solar cell module is placed outdoors so as to be exposed to sunlight over a long period of time, resulting in a remarkable reduction in the photoelectric conversion efficiency of the solar cell element. This situation is apparent from FIG. 3, which shows a graph of the changes in light transmittance of EVA and epoxy resin when exposed to sunlight. Thus, it is apparent that epoxy resin is also not usable in place of EVA as the filler 206.

SUMMARY OF THE INVENTION

The present invention is aimed at eliminating the foregoing problems in the known solar cell module.

Another object of the present invention is to provide an improved solar cell module which is free of short-circuits between the grid electrode and lower electrode even upon repeated use under severe environmental conditions of high temperature and high humidity, and continuously exhibits a desirable photoelectric conversion efficiency over a long period of time.

A further object of the present invention is to provide an improved, reliable solar cell module which excels in weather resistance and continuously exhibits a desirable photoelectric conversion efficiency without deterioration even upon repeated use over a long period of time under severe environmental conditions of high temperature and high humidity.

A further object of the present invention is to provide an improved, reliable amorphous silicon solar cell module which excels in permeability to light and exhibits a desirable photoelectric conversion efficiency over a long period of time without the permeability to light deteriorating.

A further object of the present invention is to provide a reliable amorphous silicon solar cell module provided with an improved grid electrode, which can be mass-produced at a reduced production cost.

The above-described and other objects, advantages, and features of the present invention will become more apparent upon making reference to the following specification, claims and drawings.

BRIEF DESCRIPTION OF THE DRAWINGS

FIG. 7 shows graphs of the changes in photoelectric conversion efficiency with respect to exposure periods of each of the a-Si solar cell modules obtained in Examples 1 and 2 and Comparative Examples 1 and 2.

DETAILED DESCRIPTION OF THE INVENTION

Figure 1:
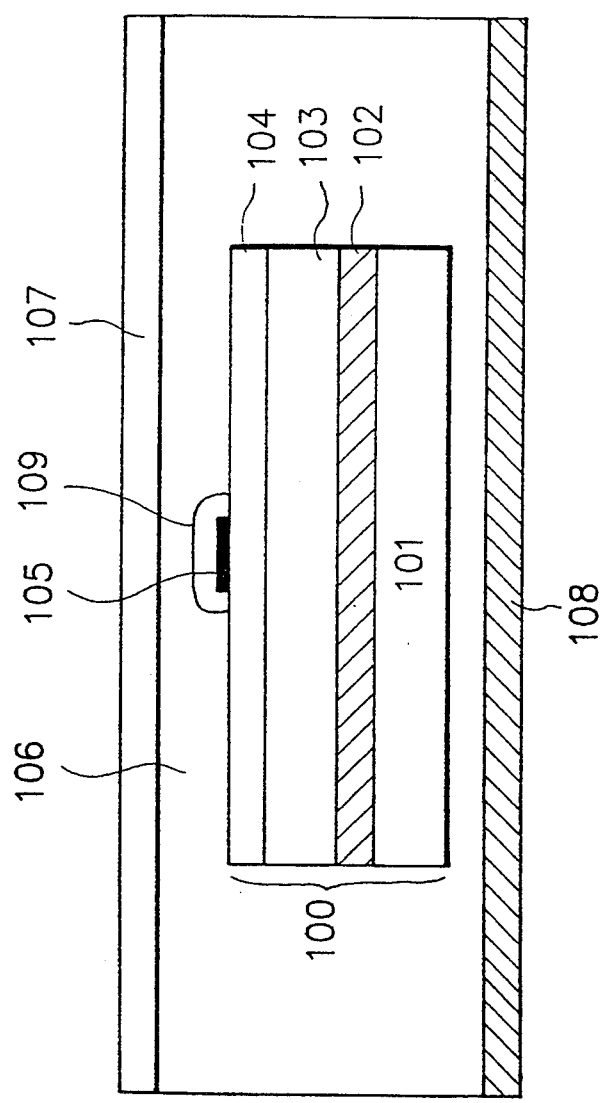
FIG. 1 is a schematic view illustrating the configuration of an embodiment of an a-Si solar cell module according to the present invention.
Figure 2:
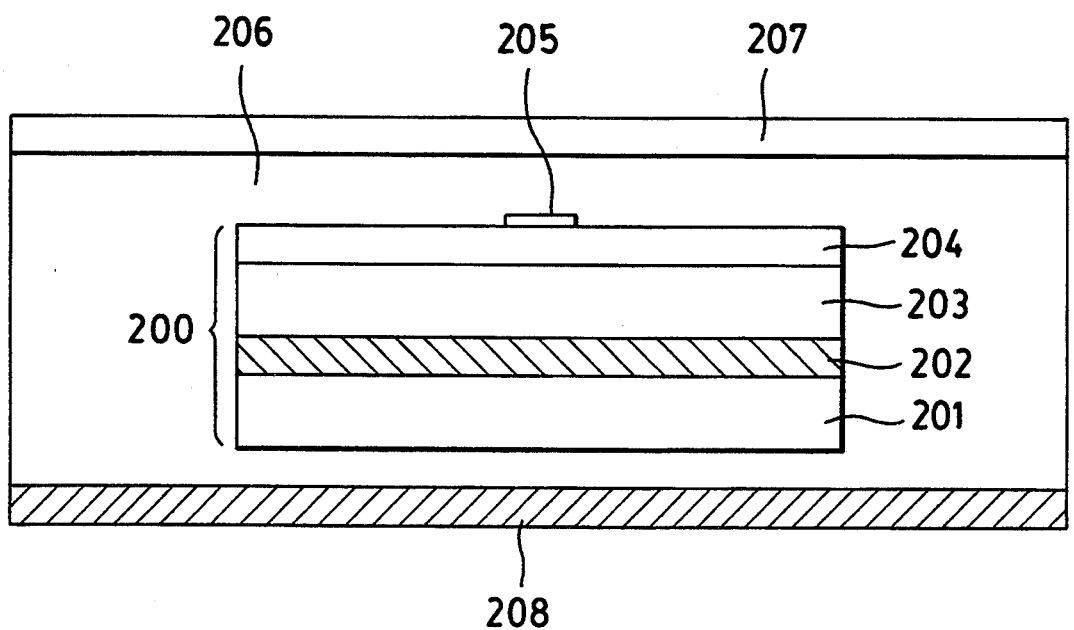
FIG. 2 is a schematic view of the configuration of a conventional a-Si solar cell module.
Figure 3:
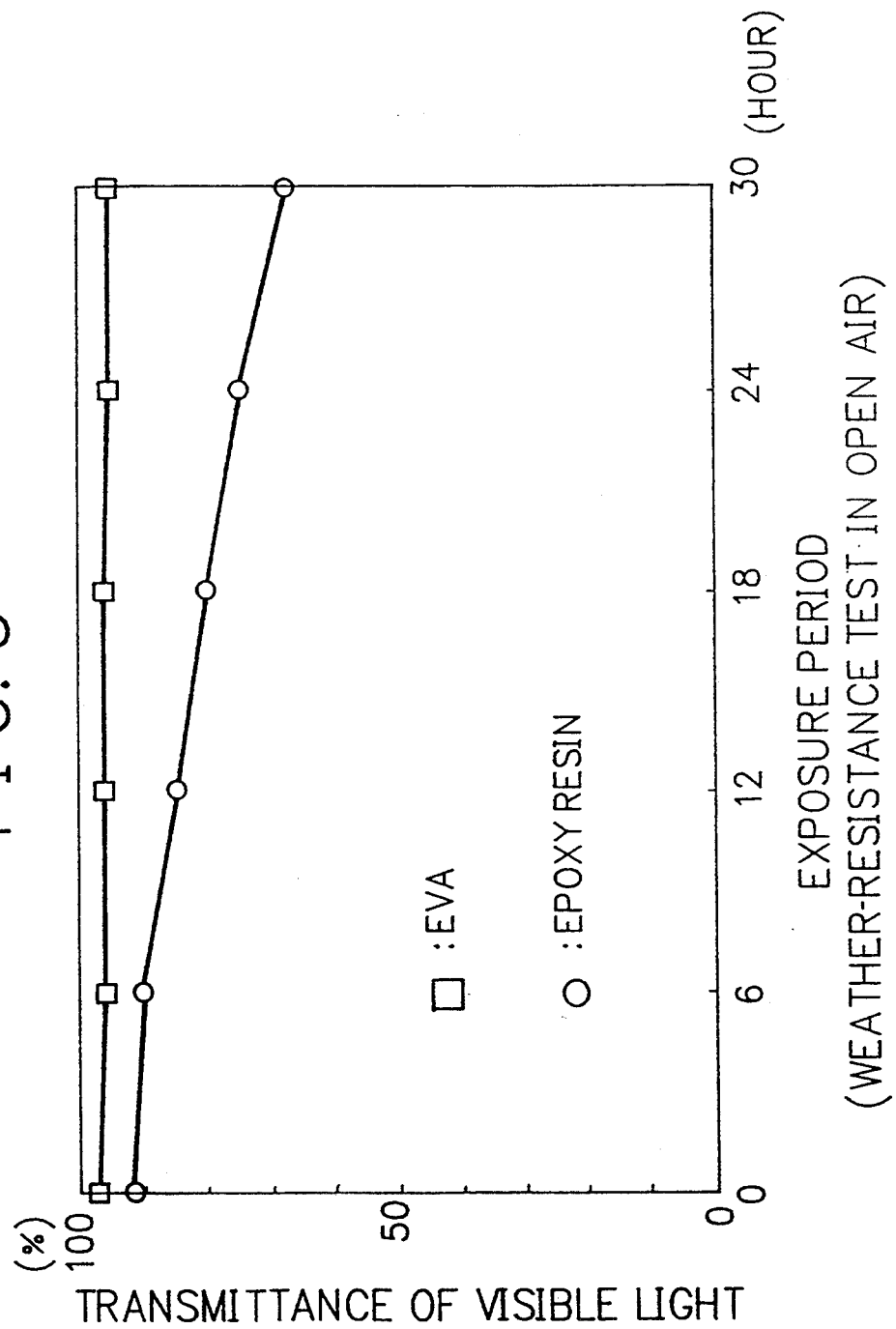
FIG. 3 shows graphs of the results obtained in climatic tests of EVA and epoxy resin.

The present invention provides an improved a-Si solar cell module which is free of the foregoing problems of the conventional a-Si solar cell module and which attains the above objects.

The feature of the present invention lies in an improvement in the solar cell module which comprises an amorphous silicon solar cell element body enclosed by a filler, said amorphous solar cell element comprising a metal electrode layer, an amorphous silicon semiconductor layer (hereinafter referred to as a-Si semiconductor layer) having a pin junction, a transparent and conductive electrode layer, and a grid electrode disposed in this order on a conductive substrate, said element body being disposed on a base member serving as a rear face protective member, said improvement being characterized in that said grid electrode has a coating comprising an epoxy resin of 20 $g/m^2$.day.0.1 mm/40° C.90%RH or less in moisture permeability which covers the entire exposed exterior of said grid electrode.

The a-Si solar cell module according to the present invention usually comprises a plurality of a-Si solar cell element bodies respectively of the above configuration, said plurality of a-Si solar cell element bodies being spaced apart on a base member serving as a rear face protective member, the respective a-Si solar cell elements of said plurality of a-Si solar cell element bodies being electrically connected with each other in series by wiring the grid electrode of one a-Si solar cell element with the conductive substrate of the other a-Si solar cell element.

The a-Si solar cell module thus configured according to the present invention is free of the foregoing problems relative to the frequency of short-circuits as in the prior art, even upon repeated use under severe environmental conditions of high temperature and high humidity, and it exhibits a stable, desirable photoelectric conversion efficiency over a long period of time without deterioration. Particularly, in the a-Si solar cell module of the present invention, moisture does not permeate the grid electrode upon continuously exposing the a-Si solar cell element of the a-Si solar cell module to sunlight even under severe environmental conditions of high temperature and high humidity because the grid electrode is covered by the specific epoxy resin as above described. The a-Si solar cell element of the a-Si solar cell module is always maintained in a desirable state such that it exhibits stable, desirable photoelectric conversion efficiency.

The a-Si solar cell module according to the present invention is greatly advantageous since it functions without having any surface protective member. This results in reducing the production cost remarkably.

It is a matter of course that the a-Si solar cell module may be provided with a surface protective member. In this case, the stability of the a-Si solar cell element is further secured.

In the following, the a-Si solar cell module will be explained in more detail while referring to the drawings.

Shown in FIG. 1 is a schematic view illustrating the configuration of an embodiment of the a-Si solar cell module according to the present invention.

In FIG. 1, reference numeral 100 indicates an a-Si solar cell element which comprises a metal electrode layer 102, an a-Si semiconductor layer 103 having a pin junction, and a transparent and conductive layer 104 disposed in this order on a conductive substrate 101. Reference numeral 105 indicates a grid electrode. Reference numeral 109 indicates a coating comprising a specific epoxy resin of 20 g/m$^2$.day.0.1 mm/40° C.90%RH or less in moisture permeability which covers the entire exposed exterior of the grid electrode 105. Reference numeral 106 indicates a filler which encloses the entire exterior of the a-Si solar cell element 100. Reference numeral 107 indicates a weather-resistant protective member (or a surface protective member), which is disposed on the surface of the filler 106 in cases where necessary. Reference numeral 108 indicates a base member (or a rear face protective member).

As for the material of the substrate 101 of the a-Si solar cell element 100, there is no particular restriction as long as it is conductive. Specifically, it may be a conductive member composed of a metal such as Al, Cu, etc., a conductive member composed of an alloy such as stainless steel, etc., or a conductive member composed of another type of conductive material such as carbon, etc. In a preferred embodiment, the substrate 101 comprises a stainless steel member.

The metal electrode layer 102 (the lower electrode) of the a-Si solar cell element is formed f a metal such as Ti, Cr, Mo, Fe, Cu, Nb, Zn, W, Al, Ag, Ni, etc. The metal electrode layer 102 may be formed by means of conventional resistance heating evaporation, electron beam evaporation, or sputtering. In the case where the substrate 101 is desirably conductive, the metal electrode layer 102 is not always necessary.

The a-Sir solar cell element 100 may comprise a single pin junction amorphous silicon semiconductor cell, a tandem type semiconductor cell comprising two stacked pin junction amorphous silicon semiconductor cells, or a tandem type semiconductor cell comprising three stacked pin junction amorphous silicon semiconductor cells. The a-Si semiconductor layer 103 may be formed by means of a conventional plasma CVD technique or light-induced CVD technique selectively using silane gas, hydrogen gas, and a gas capable of providing a dopant impurity, such as phosphine, diborane or the like.

Alternatively, the a-Sir semiconductor solar cell 100 may be comprised of a pin amorphous silicon semiconductor cell stacked on a pn junction semiconductor layer formed by a conventional epitaxial growth technique.

The transparent and conductive layer 104 of the a-Si solar cell 100 is formed of In$_2$O$_3$, SnO$_2$, In$_2$O$_3$-SnO$_2$ (ITO), ZnO, TiO$_2$, or CdSnO$_4$. The transparent and conductive layer 104 may be formed by means of conventional resistance heating evaporation, electron beam evaporation, sputtering, spraying, or CVD.

The grid electrode 105 of the a-Si solar cell element 100 is formed of a material comprising powdered Ag dispersed in a binder resin such as phenol resin, urethane resin, rubber, polyester, or acrylic resin. The grid electrode 105 may be formed by providing a Ag paste comprising powdered Ag dispersed in one of the above-mentioned binder resins and subjecting the Ag paste to screen printing. The Ag paste may contain metal powder, other than Ag, such as Ti, Au, Zn, Cr, Mo, W, Al, Ni, Cu, or Sn in an appropriate amount. A pronounced effect is provided in the case where the grid electrode 105 is formed of the Ag paste.

As above described, the principal feature of the present invention lies in the coating 109 comprising a specific epoxy resin of 20 g/m$^2$.day.0.1 mm/40° C.90%RH or less in moisture permeability which is disposed so as to cover the entire exposed exterior of the grid electrode 105.

The above epoxy resin which constitutes the coating 109 has a light-transmitting property because if the epoxy resin is not light transmissive, it becomes a shadow loss factor leading to a reduction in the photoelectric conversion efficiency of the a-Si solar cell element. In addition, the epoxy resin constituting the coating 109 must have a refractive index which is greater than that of the filler 106. In the case where the epoxy resin has a greater refractive index than that of the filler 106, light impinged through the surface protective member 107 and the filler 106 is reflected at the interface between the epoxy resin and the filler 106 before arriving at the grid electrode, resulting in an improvement in the photoelectric conversion efficiency.

Examples of such epoxy resin are bisphenol A epoxy resin, bisphenol F epoxy resin, cycloaliphatic epoxy resin, and phenol novolak epoxy resin. Among these epoxy resins, bisphenol A epoxy resin is the most desirable in view of humidity resistance and adhesion. As the curing agent used with the epoxy resin, there can be mentioned aliphatic polyamines, modified aliphatic polyamines, aromatic polyamines, modified aromatic polyamines, cycloaliphatic polyamines, modified cycloaliphatic polyamines, polyamideamines, modified polyamideamines, imidazole, and derivatives thereof.

There are various commercially available epoxy resins as the above epoxy resins in combination with appropriate curing agents.

Commercially available examples as the foregoing epoxy resins are those produced by Three Bond Co., Ltd. under the trade identifications 2001, 2002H, 2003, 2016B, and 022; and commercially available curing agents used in combination with these epoxy resins are those produced by the same company under the trade identifications 2102B, 2103, 2104, 2105C, 2105F, 2106, 2131B, 2131D, 2131F and 2163.

Commercially available examples of the combination of the epoxy resin with an appropriate curing agent are those produced by Sumitomo 3M Ltd. under the trademark names EW-2 (one-part type), S/W-2214 (one-part type), XA7416 (one-part type), JA7437 (one-part type), 1838B/A (two-part type, the volumetric mixing ratio of the epoxy resin to the curing agent is 4:5), S/W-2216B/A, DP-100 (two-part type, the volumetric mixing ratio of the epoxy resin to the curing agent is 1:1), DP-100 (two-part type, the volumetric mixing ratio of the epoxy resin to the curing agent is 1:1), DP-110 (two-part type, the volumetric mixing ration of the epoxy resin to the curing agent is 1:1), DP-190 (two-part type, the volumetric mixing ratio of the epoxy resin to the curing agent is 1:1), DP-PURE60 (two-part type, the volumetric mixing ratio of the epoxy resin to the curing agent is 1:1), and DP-270 (two-part type, the volumetric mixing ratio of the epoxy resin to the curing agent is 1:1).

There are other commercially available examples of the foregoing epoxy resins: Epicote 812, 815, 827, 828 and 834 produced by Yuka Shell Epoxy Kabushiki Kaisha. These epoxy resins are used in combination with appropriate curing agents.

Further commercially available examples of the combination of the epoxy resin with an appropriate curing agent are those produced by Asahi-Ciba Ltd.: epoxy resin AY-103/curing agent HY956 (the mixing ratio, parts by weight: 100/17), epoxy resin AY-105/curing agent HY956 (the mixing ratio, part by weight: 100/17), epoxy resin AW-106/curing agent HY953U (the mixing ratio, part by weight: 100/60), epoxy resin AV-121/curing agent HY956 (the mixing ratio, part by weight: 100/8), epoxy resin AV-123B/curing agent HY956 (the mixing ratio, part by weight: 100/11), epoxy resin AV-129/curing agent HY956 (the mixing ratio, part by weight: 100/13), epoxy resin AW-136/curing agent HY994 (the mixing ratio, part by weight: 100/40), epoxy resin AV-138/curing agent HV998 (the mixing ratio, part by weight: 100/40), epoxy resin AV-144/curing agent HY997 (the mixing ratio, part by weight: 100/60), epoxy resin AW-2101/curing agent HW2951 (the mixing ratio, part by weight: 100/100), epoxy resin AW-2104/curing agent HW2934 (the mixing ratio, parts by weight: 100/100), and epoxy resin AV-1580/curing agent HV1580 (the mixing ratio, part by weight: 100/100).

Still further commercially available examples of the foregoing epoxy resins are those produced by Tohto Kasei Co., Ltd. under the trademarks of YD-115, YD-116, YD-119, YD-126, YD-127, YD-128, YD-134, YD-001, YD-011, YD-012, YD-013, YD-014, YD-017, YD-019 and YD-020. Examples of the curing agent used in combination with these epoxy resins are those produced by the same company under the trademark names of G-series curing agent, TH-series curing agent, KHX-series curing agent, and ZX-series curing agent.

The thickness of the coating 109 constituted by the above-specified epoxy resins is preferably in the range of 10 to 200 μm, more preferably in the range of 50 to 150 μm.

Figure 4:
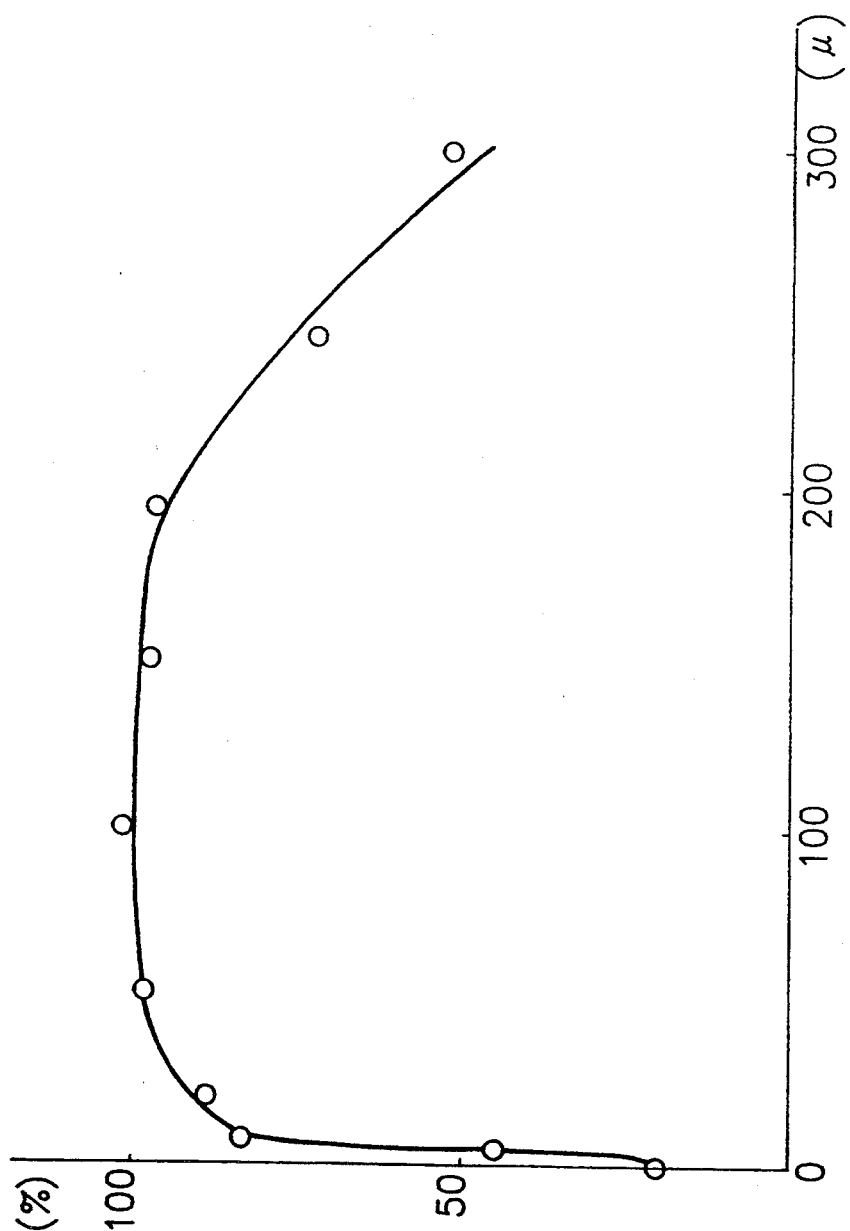
FIG. 4 shows a graph of the results obtained as a result of evaluating the photoelectric conversion efficiency of various a-Si solar cell elements respectively provided with an epoxy resin coating of a different thickness at the grid electrode.

Determination of the thickness of the coating 109 is based on the findings shown in FIG. 4. Shown in FIG. 4 are the results obtained by performing an evaluation as follows. That is, there were provided a plurality of a-Si solar cell module samples of the configuration shown in FIG. 1 respectively having an epoxy resin coating 109 of a different thickness disposed so as to cover the entire exposed exterior of the grid electrode 105. As for each of the a-Si solar cell module samples, there was observed (i) an initial photoelectric conversion efficiency by subjecting the a-Si solar cell module sample to irradiation of AM 1.5 light (100 mW/cm$^2$) to measure the power (W) outputted; then, after a forward bias voltage of 0.3 volt was applied between the grid electrode and the lower electrode (i.e., a positive bias voltage was applied to the grid electrode) for 24 hours under conditions of high temperature and high humidity, there was observed (ii) a final photoelectric conversion efficiency by subjecting the a-Si solar cell module sample to irradiation of AM 1.5 light (100 mW/cm$^2$) to measure the power (W) outputted. The percent change between the initial photoelectric conversion efficiency (i) and the final photoelectric conversion efficiency (ii) for each of the a-Si solar cell module samples was determined. The results are graphically shown in the relationship between the thickness of the coating 109 and the change in photoelectric conversion efficiency.

Each of the above plurality of a-Si solar cell module samples was prepared as follows. That is, on a stainless steel substrate 101 of 0.1 mm thickness there were formed a 5000 Å thick Al-Si alloy layer as the lower electrode 102, a 4000 Å thick pin junction a-Si layer as the a-Si semiconductor layer 103, and an 800 Å thick layer composed of $In_2O_3$-$SnO_2$ as the transparent and conductive layer 104 by means of conventional film-forming techniques. On the transparent and conductive layer 104 there was formed a grid electrode 105 by applying an Ag paste (Ag Paste 5007: trademark name, produced by Du Pont Company) by means of a conventional screen printing technique. The entire exposed exterior of the grid electrode thus formed was covered by applying an epoxy resin of 2.5 g/μm$^2$.day.0.1 mm/40° C.90%RH in moisture permeability (trademark name: DP-190GRAY, produced by 3M Company) at a given thickness by means of a conventional screen printing technique. Thus, there was obtained an a-Si solar cell element. The resultant a-Si solar cell element was sandwiched between corresponding members to obtain a laminate of ethylene-tetrafluoroethylene copolymer film (trademark name: Tefzel film, produced by Du Pont Company)/EVA sheet/the a-Si solar cell element/EVA sheet/galvanized steel (produced by Daido Steel Sheet Mfg. Co., Ltd.) laminated in this order from the top toward the bottom. The laminate was introduced into a vacuum laminator, wherein the EVA sheets were fused at a temperature of 150° C. to thereby seal the laminate. Thus, there were obtained a plurality of a-Si solar cell modules which were different with respect to the thickness of the epoxy resin coating 109.

From the results shown in FIG. 4, the following was obtained. That is, in the case where the epoxy resin coating 109 disposed on the grid electrode 105 of the a-Si solar cell element 100 is of a thickness in the range of 10 to 200 μm, there is no distinguishable change between the initial photoelectric conversion efficiency and the photoelectric conversion efficiency after a prescribed voltage had been applied between the grid electrode and the lower electrode under severe conditions of high temperature and high humidity, whereby a positive bias voltage was applied to the grid electrode. And, a marked effect occurs in the case where the thickness of the epoxy resin coating 109 is in the range of 50 to 150 μm.

On the other hand, in the case where the thickness of the epoxy resin coating 109 is less than 10 μm, pinholes in the epoxy resin coating allow moisture to permeate those pinholes to arrive at the portion under the grid electrode under conditions of high temperature and high humidity, resulting in short-circuits between the grid electrode and the lower electrode. As a result, the photoelectric conversion efficiency is remarkably reduced. Similarly, in the case where the thickness of the epoxy resin coating 109 exceeds 200 μm, cracks in the epoxy resin coating allow moisture to permeate those cracks to arrive at the portion under the grid electrode under conditions of high temperature and high humidity, resulting in short-circuits between the grid electrode and the lower electrode. As a result, the photoelectric conversion efficiency is remarkably reduced.

As the filler 106 which is provided to encapsulate the entire exterior of the a-Si solar cell element 100, there is used a light transmissive, insulating resin such as ethylene-vinyl acetate copolymer (EVA), polyvinyl butyral, silicone resin, and the like.

As above mentioned, it is not always necessary to provide the a-Si solar cell module according to the present invention with the weather-resistant protective member (the surface protective member) 107. However, in the case where the surface protective member 107 is disposed, stability of the a-Si solar cell element 100 is further ensured. The surface protective member 107 is desired to be a member capable of effectively allowing light to pass through and which is resistant to ultraviolet rays and ozone and excels in weather resistance. Specific examples are fluorine-containing resin film, silicone resin film, and the like.

The a-Si solar cell module of the configuration shown in FIG. 1 and as above described may be prepared by a conventional technique, for example, in the following manner. That is, an a-Si solar cell element 100 is first prepared by forming, on a substrate 101, a metal electrode layer 102, an a-Si semiconductor layer 103 having a pin junction, a transparent and conductive layer 104, and a grid electrode 105 in this order by the appropriate layer-forming techniques. The entire exposed exterior of the grid electrode 105 is covered by a coating comprising the foregoing specific epoxy resin. The result is encapsulated by using the foregoing filler 106, the foregoing weather-resistant member (surface protective member) 107, and a base member (rear face protective member) 108.

The formation of the coating comprising the foregoing specific epoxy resin over the grid electrode may be carried out, for example, by applying the foregoing specific epoxy resin to the exposed exterior of the grid electrode by means of a conventional screen printing technique to form a coating of a predetermined thickness to cover the entire exposed exterior of the grid electrode. The encapsulation of the a-Si solar cell element may be performed by first interposing the a-Si solar cell element of the present invention between two sheets capable of serving as the filler 106 to obtain a laminate comprising base member 108/filler 106/a-Si solar cell element 100/filler 106/surface protective member 107 and subjecting the laminate to heat treatment at a prescribed temperature while pressing the laminate so that the fillers 106 are fused while removing gas contained in the laminate. By this method, a desirable a-Si solar cell module of the present invention is obtained.

EXAMPLE 1

Figure 5:
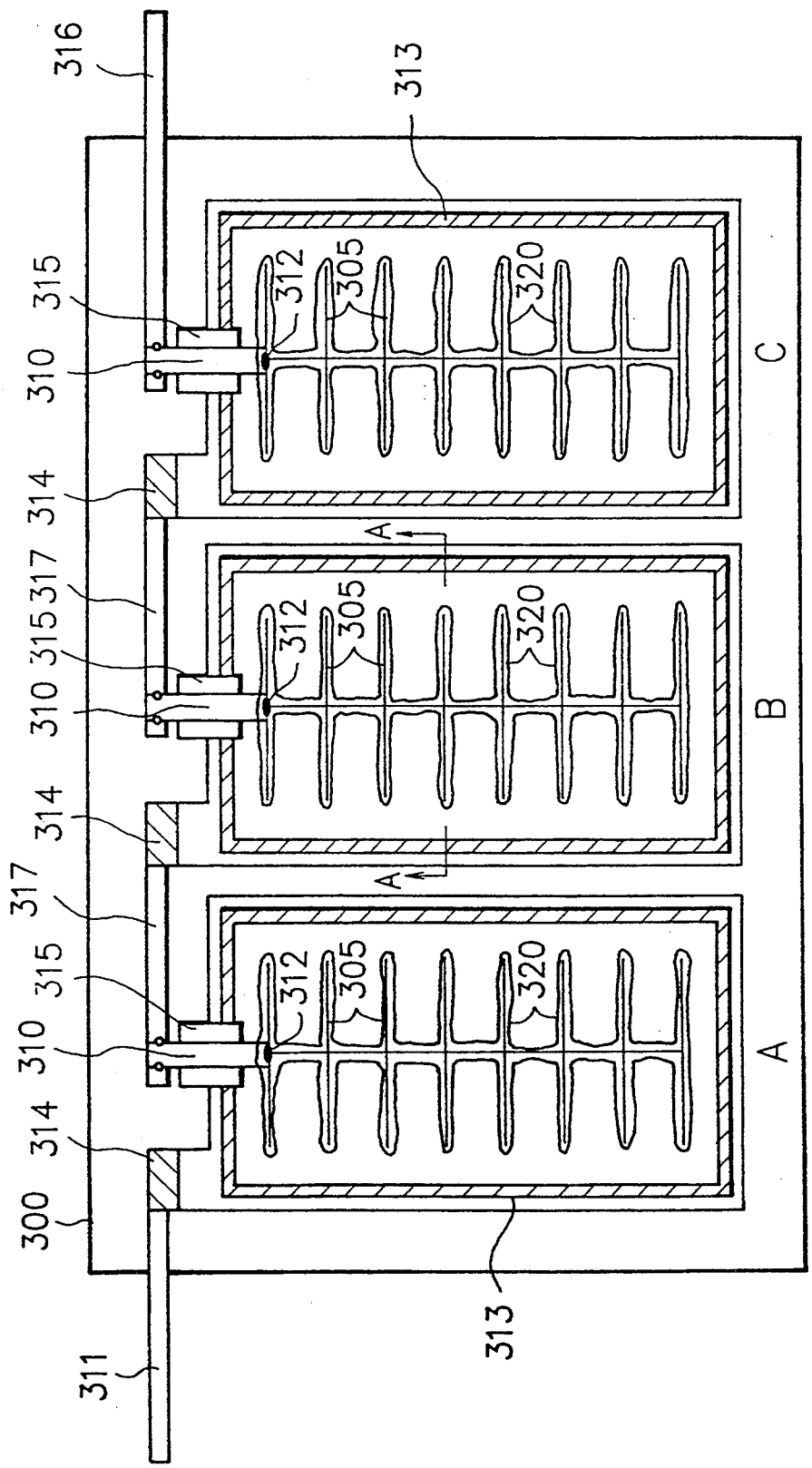
FIG. 5 is a schematic top view illustrating the configuration of an embodiment of an a-Si solar cell module comprising a plurality of a-Si solar cell elements integrated in series connection.

There was prepared an a-Si solar cell module comprising three a-Si solar cell elements integrated in series connection as shown in FIG. 5. FIG. 5 is a schematic top view illustrating the configuration of said a-Si solar cell module. Shown in FIG. 6 is a schematic cross-section view taken along line A—A' in FIG. 5.

Figure 6:
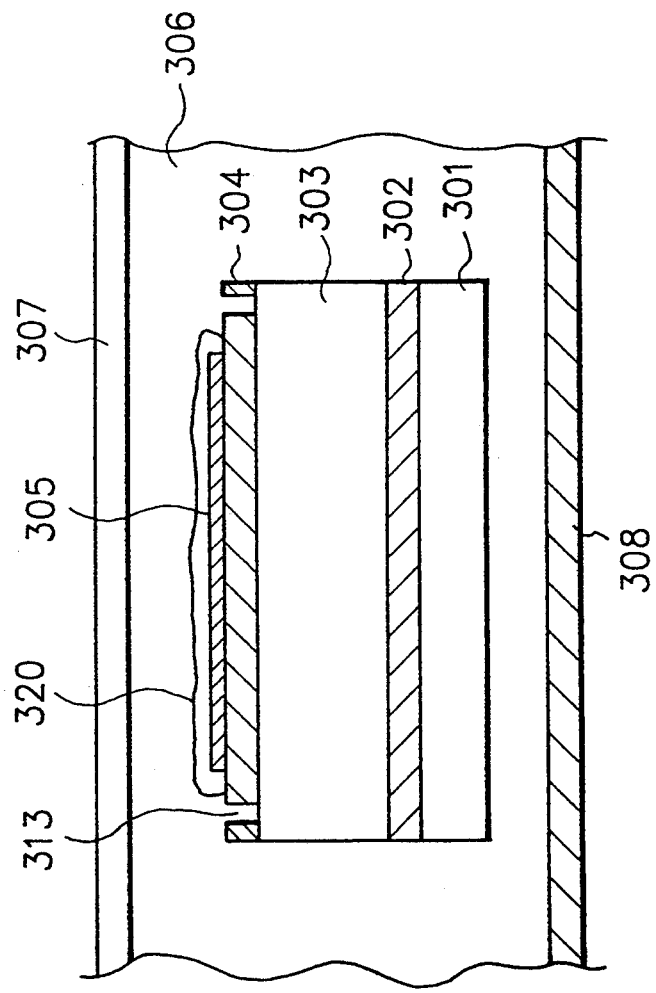
FIG. 6 is a schematic cross-section view taken along line A—A' in FIG. 5.

In FIGS. 5 and 6, reference numeral 301 indicates a stainless steel substrate, reference numeral 302 indicates a lower electrode layer composed of an Al-Si alloy, reference numeral 303 indicates a pin-junction structured a-Si semiconductor layer, reference numeral 304 indicates a transparent and conductive layer composed of ITO, reference numeral 305 indicates an Ag grid electrode, reference numeral 306 indicates a filler comprising ethylene-vinyl acetate copolymer (EVA), reference numeral 307 indicates a surface protective member composed of ethylenetetrafluoro-ethylene copolymer, and reference numeral 308 indicates a base member made of galvanized steel. Reference numeral 310 indicates a tin-plated copper foil which electrically connects the grid electrode 305 to a copper foil 317 extending from the substrate side of the adjacent a-Si solar cell element, wherein the copper foil serves to electrically connect a pair of adjacent a-Si solar cell elements in series. Reference numerals 311 and 316 indicate copper foil lead wires on the cathode side. Reference numeral 316 indicates a copper foil lead wire on the anode side. Reference numeral 312 indicates an adhesive Ag ink which connects the grid electrode 305 to the tin-plated copper foil 310. Reference numeral 313 indicates an element dividing portion. Reference numeral 314 indicates an exposed portion of the stainless steel substrate 301 for spotwelding the copper foils 311 and 317. Reference numeral 315 indicates an insularire tape for preventing occurrence of a short-circuit. Reference numeral 320 indicates an epoxy resin member which covers the grid electrode 305 and the adhesive Ag ink 312.

First, there was provided a stainless steel web of 0.1 mm in thickness as the substrate 301. On the stainless steel web 301 there was formed a 5000 Å thick Al-Si alloy layer as the lower electrode S2 by means of a conventional sputtering process wherein a target comprising an Al-Si alloy containing Si in an amount of 1% by weight was used. Then, on the Al-Si alloy layer as the lower electrode 302 there was formed a 4400 Å thick pin-junction containing a-Si semiconductor layer 303 by means of a conventional plasma CVD process wherein a 300 Å thick n-type a-Si semiconductor layer was formed using SiH$_4$ gas, H$_2$ gas, and PH$_3$ gas, a 4000 Å thick i-type a-Si semiconductor layer was formed using SiH$_4$ gas and H$_2$ gas, and a 100 Å thick p-type a-Si semiconductor layer was formed using SiH$_4$ gas, H$_2$ gas, and B$_2$H$_6$. Thereafter, there was formed a 800 Å thick ITO layer as the transparent and conductive layer 304 on the pin-type a-Si semiconductor layer 303 by means of a conventional resistance heating evaporation process. Thus, there was obtained an intermediate stage of an a-Si solar cell element.

The result was cut into three pieces (A, B, and C, see FIG. 5) of equal size (10 cm × 5 cm) by means of a press machine. At the respective sections, the constituent members were crushed to cause short-circuits between the ITO layer and the stainless steel substrate. In order to repair the short-circuits, for each of the three a-Si solar cell element intermediates, the corresponding portion of the ITO layer situated where the short-circuit occurred was removed in the following manner, to thereby form element dividing portions 313 (see FIG. 6). That is, an etchant comprising FeCl$_3$ capable of selectively dissolving only the ITO layer without dissolving the a-Si semiconductor layer situated thereunder was applied to the periphery of the ITO layer situated slightly inside the section by means of a conventional screen printing technique to thereby remove the corresponding portion, followed by washing with water, thereby forming the element dividing portions 313 at the ITO layer.

On the ITO layer 304 of each of the three a-Si solar cell element intermediates thus treated there was formed a grid electrode 305 by applying an Ag paste containing polyester resin as the binder resin (Ag Paste 5007: trademark name, produced by Du Pont Company) by means of a conventional screen printing technique. Thus, there were obtained three a-Si solar cells elements (A, B, and C)(see FIG. 5).

For each of the resultant three a-Si solar cell elements, a tin-plated copper tape as a collecting electrode of the grid electrode 305 was arranged at right angles to the grid electrode (see 310 in FIG. 5). Then, an adhesive Ag ink (C-220: trademark name, produced by Emerson & Cuming Inc.) was dropwise applied to the intersection between the grid electrode 305 and the tin-plated copper tape 310, followed by drying at 150° C. for 30 minutes, whereby the grid electrode was connected to the tin-plated copper tape (see 312 in FIG. 5). Successively, for each of the three a-Si solar cell modules A, B, and C, a polyimide tape was fixed to a position under the tin-plated copper tape 310 in order to insure insulation between the grid electrode and the stainless steel substrate.

Thereafter, for each of the three intermediates, part of the solar cell element comprising the ITO layer/the a-Si semiconductor layer/the Al-Si alloy layer was removed using a grinder to expose part of the stainless steel substrate (see 314 in FIG. 5), followed by welding of copper foils thereto using a spotwelder (see 311 and 317 in FIG. 5).

Then, the three a-Si solar cell elements A, B, and C were serially integrated by way of soldering the copper foils 317 with the tin-plated copper tapes 310.

On the respective grid electrodes 305 and the respective adhesive Ag inks 312, there was applied a bisphenol A two-part epoxy resin produced by Three Bond Kabushiki Kaisha (epoxy resin: 2022/curing agent: 2106) of 2 g/m$^2$.day.0.1 mm/40° C.90%RH in moisture permeability at a thickness of 100 μm using a dispenser, followed by drying at 150° C. for 2 hours to thereby cure the epoxy resins, wherein the exposed exterior of the grid electrode of each of the three a-Si solar cell elements A, B, and C was covered by a coating comprising the epoxy resin (see 320 in FIG. 5).

The resultant integrated a-Si solar cell element body comprising the three a-Si solar cell elements connected in series was sandwiched between corresponding members to obtain a laminate of ethylene-tetrafluoroethylene copolymer film (trademark name: Tefzel film, produced by Du Pont Company)/EVA sheet/the integrated a-Si solar cell element body/EVA sheet/galvanized steel (produced by Daido Steel Sheet Mfg. Co., Ltd.) laminated in this order from the top toward the bottom. The laminate was introduced into a vacuum laminator, wherein the EVA sheets were fused at a temperature of 150° C. while removing gas contained in the laminate by virtue of pressure to thereby seal the laminate. The ethylenetetra-fluoroethylene copolymer film used above had been subjected to plasma treatment in advance in order to improve the adhesion with the EVA.

Thus, there was obtained an a-Si solar cell module comprising three a-Si solar cell elements integrated in series connection as shown in FIG. 5.

As for the a-Si solar cell module thus obtained, there was observed (i) an initial photoelectric conversion efficiency by subjecting the a-Si solar cell module to irradiation of AM 1.5 light (100 mW/cm$^2$) to measure the power (W) outputted; then after a forward bias voltage of 0.3 volt was applied between the grid electrode and the lower electrode (wherein a positive bias voltage was applied to the grid electrode) for 24 hours under conditions of 85° C. for environmental temperature and 85% for environmental humidity, there was observed (ii) a final photoelectric conversion efficiency by subjecting the a-Si solar cell module to irradiation of AM 1.5 light (100 mW/cm$^2$) to measure the power (W) outputted. As a result, it was found that there was no substantial change between the initial photoelectric conversion efficiency (i) and the final photoelectric conversion efficiency (ii). In view of the above, it was recognized that the a-Si solar cell module excels in solar cell characteristics and is practically usable.

EXAMPLE 2

There was prepared an a-Si solar cell module of the configuration shown in FIGS. 5 and 6 by repeating the procedures of Example 1, except that the ethylenetetrafluoroethylene copolymer film as a surface protective member was not used.

As for the a-Si solar cell module obtained, there was observed (i) an initial photoelectric conversion efficiency by subjecting the a-Si solar cell module to irradiation of AM 1.5 light (100 mW/cm$^2$) to measure the power (W) outputted; then, after a forward bias voltage of 0.3 volt was applied between the grid electrode and the lower electrode (wherein a positive bias voltage was applied to the grid electrode) for 24 hours under conditions of 85° C. for environmental temperature and 85% for environmental humidity, there was observed (ii) a final photoelectric conversion efficiency by subjecting the a-Si solar cell module to irradiation of AM 1.5 light (100 mW/cm$^2$) to measure the power (W) outputted. As a result, it was found that there was no substantial change between the initial photoelectric conversion efficiency (i) and the photoelectric conversion efficiency (ii).

In view of the above, it was recognized that the a-Si solar cell module excels in solar cell characteristics and is practically usable.

COMPARATIVE EXAMPLE 1

There was prepared a conventional a-Si solar cell module by repeating the procedures of Example 1, except that an epoxy resin coating was not formed at the grid electrode of each of the three a-Si solar cell elements A, B, and C.

As for the a-Si solar cell module obtained, there was observed (i) an initial photoelectric conversion efficiency by subjecting the a-Si solar cell module to irradiation of AM 1.5 light (100 mW/cm$^2$) to measure the power (W) outputted; then, after a forward bias voltage of 0.3 volt was applied between the grid electrode and the lower electrode (wherein a positive bias voltage was applied to the grid electrode) for 24 hours under conditions of 85° C. for environmental temperature and 85% for environmental humidity, there was observed (ii) a final photoelectric conversion efficiency by subjecting the a-Si solar cell module to irradiation of AM 1.5 light (100 mW/cm²) to measure the power (W) outputted. As a result, it was found that there was a significant change between the initial photoelectric conversion efficiency (i) and the final photoelectric conversion efficiency (ii), particularly the initial photoelectric conversion efficiency was reduced by about 50% after the above endurance.

In view of this, it was recognized that the conventional a-Si solar cell module is apparently poor in solar cell characteristics.

COMPARATIVE EXAMPLE 2

There was prepared a comparative a-Si solar cell module by repeating the procedures of Example 2, except that an epoxy resin coating was not formed at the grid electrode of each of the three a-Si solar cell elements A, B, and C.

As for the a-Si solar cell module obtained, there was observed (i) an initial photoelectric conversion efficiency by subjecting the a-Si solar cell module to irradiation of AM 1.5 light (100 mW/cm²) to measure the power (W) outputted; then, after a forward bias voltage of 0.3 volt was applied between the grid electrode and the lower electrode (wherein a positive bias voltage was applied to the grid electrode) for 24 hours under conditions of 85° C. for environmental temperature and 85% for environmental humidity, there was observed (ii) a final photoelectric conversion efficiency by subjecting the a-Si solar cell module to irradiation of AM 1.5 light (100 mW/cm²) to measure the power (W) outputted. As a result, it was found that there was a significant change between the initial photoelectric conversion efficiency (i) and the final photoelectric conversion efficiency (ii), in particular, the initial photoelectric conversion efficiency was reduced by about 30% after the above exposure.

In view of this, it was recognized that the conventional a-Si solar cell module is apparently poor in solar cell characteristics.

Shown in FIG. 7 are the results obtained in Examples 1 and 2 and Comparative Examples 1 and 2.

From what is shown in FIG. 7, it is understood that each of the a-Si solar cell modules obtained in Examples 1 and 2 of the present invention in which the grid electrode is provided with a coating comprising the specific epoxy resin surpasses any of the comparative a-Si solar cell modules obtained in Comparative Examples 1 and 2 with respect to photoelectric conversion efficiency provided after exposure over a long period of time. More particularly, it is understood that each of the a-Si solar cell modules obtained in Examples 1 and 2 of the present invention continuously exhibits a desirable photoelectric conversion efficiency without deterioration even upon repeated use under severe environmental conditions of high temperature and high humidity. It is also understood that the a-Si solar cell module according to the present invention is greatly advantageous since it functions without requiring a surface protective member.

What is claimed is:

1. In a solar cell module which comprises an amorphous silicon solar cell element encapsulated by a filler, said amorphous silicon solar cell element comprising a metal electrode layer, an amorphous silicon semiconductor layer having a pin junction, a transparent and conductive layer, and a grid electrode disposed in this order on a conductive substrate, said solar cell element being disposed on a base member, the improvement characterized in that said grid electrode has a coating comprising an epoxy resin of g/m².day.0.1 mm/40° C.90%RH or less in moisture permeability which is disposed as to cover the entire exposed exterior of said grid electrode.

2. A solar cell module according to claim 1, wherein the epoxy resin is a member selected from the group consisting of bisphenol A epoxy resin, bisphenol F epoxy resin, cycloaliphatic epoxy resin, and phenol novolak epoxy resin.

3. A solar cell module according to claim 1, wherein the filler comprises a light comprises a light transmissive, insulating resin.

4. A solar cell module according to claim 3, wherein the light transmissive, insulating resin is a member selected from the group consisting of ethylene-vinyl acetate copolymer, polyvinyl butyral, and silicone resin.

5. A solar cell module according to claim 1, wherein the coating is of a thickness in the range of 10 to 200 μm.

6. A solar cell module according to claim 5, wherein the epoxy resin is a member selected from the group consisting of bisphenol A epoxy resin, bisphenol F epoxy resin, cycloaliphatic epoxy resin, and phenol novolak epoxy resin.

7. A solar cell module according to claim 5, wherein the filler comprises a light transmissive, insulating resin.

8. A solar cell module according to claim 7, wherein the light transmissive, insulating resin is a member selected from the group consisting of ethylene-vinyl acetate copolymer, polyvinyl butyral, and silicone resin.

9. In a solar cell module which comprises a plurality of amorphous silicon solar cell elements integrated in series connection and encapsulated by a filler, each of said plurality of amorphous silicon solar cell elements comprising a metal electrode layer, an amorphous silicon semiconductor layer having a pin junction, a transparent and conductive layer, and a grid electrode disposed in this order on a conductive substrate, said solar cell elements being disposed on a base member, the improvement characterized in that said grid electrode of each of said plurality of amorphous silicon solar cell elements has a coating comprising an epoxy resin of 20 g/m².day.0.1 mm/40° C.90%RH or less in moisture permeability which is disposed so as to cover the entire exposed exterior of said grid electrode.

10. A solar cell module according to claim 9, wherein the epoxy resin is a member selected from the group consisting of bisphenol A epoxy resin, bisphenol F epoxy resin, cycloaliphatic epoxy resin, and phenol novolak epoxy resin.

11. A solar cell module according to claim 9, wherein the filler comprises a light transmissive, insulating resin.

12. A solar cell module according to claim 11, wherein the light transmissive, insulating resin is a member selected from the group consisting of ethylene-vinyl acetate copolymer, polyvinyl butyral, and silicone resin.

13. A solar cell module according to claim 9, wherein the coating is of a thickness in the range of 10 to 200 μm.

14. A solar cell module according to claim 13, wherein the epoxy resin is a member selected from the group consisting of bisphenol A epoxy resin, bisphenol F epoxy resin, cycloaliphatic epoxy resin, and phenol novolak epoxy resin.

15. A solar cell module according to claim 13, wherein the filler comprises a light transmissive, insulting resin.

16. A solar cell module according to claim 15, wherein the light transmissive, insulating resin is a member selected from the group consisting of ethylene-vinyl acetate copolymer, polyvinyl butyral, and silicone resin.

* * * * *

UNITED STATES PATENT AND TRADEMARK OFFICE
CERTIFICATE OF CORRECTION

PATENT NO. : 5,344,498
DATED : September 6, 1994
INVENTOR(S) : YUJI INOUE

Page 1 of 2

It is certified that error appears in the above-identified patent and that said Letters Patent is hereby corrected as shown below:

COLUMN 1

Line 20, "$CO_2$." should read --$CO_2$--.
Line 23, "$CO_2$buildup." should read --$CO_2$ buildup.--.

COLUMN 4

Line 17, "+2OH$^-$," should read --+2OH$^-$,--.
Line 22, "Ag$^+$---e$^-$" should read --Ag$^+$+e$^-$--.
Line 58, "(g/m$^2$." should read --g/m$^2$--.

COLUMN 7

Line 50, "f" should read --of--.
Line 57, "a-Sir" should read --a-Si--.

COLUMN 8

Line 1, "a-Sir" should read --a-Si--.
Line 61, "022;" should read --2022;--.

COLUMN 10

Line 32, "2.5 g/µm$^2$" should read --2.5 g/m$^2$--.

COLUMN 12

Line 22, "316" should read --317--.
Line 31, "insularire" should read --insulative--.
Line 38, "electrode S2" should read --electrode 302--.

COLUMN 13

Line 13, "cells" should read --cell--.

UNITED STATES PATENT AND TRADEMARK OFFICE
CERTIFICATE OF CORRECTION

PATENT NO. : 5,344,498
DATED : September 6, 1994
INVENTOR(S) : YUJI INOUE

It is certified that error appears in the above-identified patent and that said Letters Patent is hereby corrected as shown below:

COLUMN 13

Line 65, "ethylenetetra-fluoroethylene" should read --ethylene-tetrafluoroethylene--.

COLUMN 14

Line 20, "(ii). In" should read --(ii). ¶ In--.
Line 27, "ethylenetetra-" should read --ethylene-tetra- --.

COLUMN 15

Line 67, "g/m$^2$." should read --20 g/m$^2$.--.

COLUMN 16

Line 1, "disposed" should read --disposed so--.
Line 9, "comprises a light" (second occurrence) should be deleted.
Line 61, "insult-" should read --insulat- --.

Signed and Sealed this

Twenty-first Day of February, 1995

Attest:

BRUCE LEHMAN

Attesting Officer          Commissioner of Patents and Trademarks